United States Patent
Egan et al.

(10) Patent No.: US 6,727,435 B1
(45) Date of Patent: Apr. 27, 2004

(54) BACKPLANE POWER DISTRIBUTION SYSTEM

(75) Inventors: Patrick Kevin Egan, Rochester, MN (US); Barry Lee Shepherd, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 09/590,564

(22) Filed: Jun. 8, 2000

Related U.S. Application Data

(60) Continuation-in-part of application No. 09/074,213, filed on May 7, 1998, now abandoned, which is a division of application No. 08/615,154, filed on Mar. 12, 1996, now Pat. No. 5,841,074.

(51) Int. Cl.$^7$ ................................................ H05K 1/00
(52) U.S. Cl. ........................ 174/250; 174/255; 361/792; 361/748
(58) Field of Search ................................. 174/250, 255, 174/262–266, 260; 361/792–795, 748, 780; 428/310.5, 810.5; 338/307–310

(56) References Cited

U.S. PATENT DOCUMENTS

| | | | | |
|---|---|---|---|---|
| 4,328,530 A | * | 5/1982 | Bajorek et al. | 361/762 |
| 4,450,029 A | * | 5/1984 | Holbert et al. | 156/250 |
| 4,511,950 A | * | 4/1985 | Bunner et al. | 361/788 |
| 4,587,596 A | * | 5/1986 | Bunnell | 361/749 |
| 4,616,292 A | * | 10/1986 | Sengoku et al. | 361/794 |
| 4,694,123 A | * | 9/1987 | Massey | 174/117 FF |
| 4,984,132 A | * | 1/1991 | Sakurai et al. | 361/794 |
| 5,016,138 A | * | 5/1991 | Woodman | 361/688 |
| 5,102,352 A | * | 4/1992 | Arisaka | 439/608 |
| 5,136,471 A | * | 8/1992 | Inasaka | 361/794 |
| 5,418,690 A | * | 5/1995 | Conn et al. | 361/794 |
| 5,451,720 A | * | 9/1995 | Estes et al. | 174/250 |
| 5,523,921 A | * | 6/1996 | Van Lydegraf | 361/818 |
| 5,629,839 A | * | 5/1997 | Woychik | 361/803 |
| 5,822,197 A | * | 10/1998 | Thuault | 361/803 |
| 5,841,074 A | * | 11/1998 | Egan et al. | 174/250 |

* cited by examiner

Primary Examiner—David A. Zarneke
Assistant Examiner—Jose H. Alcala
(74) Attorney, Agent, or Firm—Karuna Ojanen

(57) ABSTRACT

A powerplane for use in a backplane power distribution system. The backplane includes a conductive sheet for distributing power from a power source to a load. The powerplane further includes source locations and load locations for coupling the conductive sheet to a power source and a load. The conductive sheet has resistances with appropriate spacing and dimensions so that the resistance near the source locations is greater than the resistance farther away from the source locations. Thus, current is shared more evenly between all the load locations, and the voltage difference between distant load locations and near load locations is reduced to near zero.

16 Claims, 4 Drawing Sheets

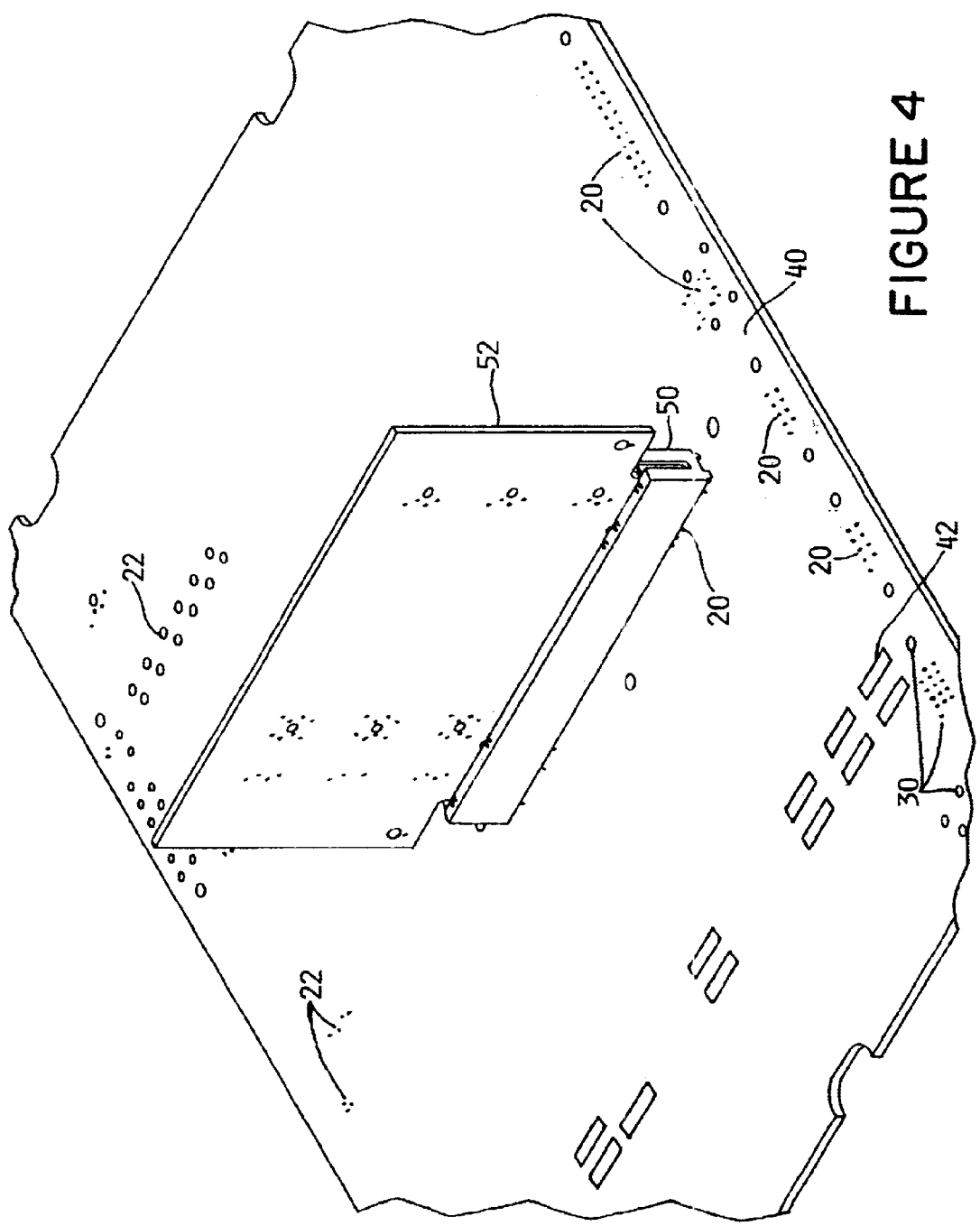

BACKPLANE POWER DISTRIBUTION SYSTEM

CROSS REFERENCE TO RELATED APPLICATION

Continuation-In-Part of prior application Ser. No. 09/074,213 filed on May 7, 1998, now abandoned, which is a divisional of prior application Ser. No. 08/615,154 filed on Mar. 12, 1996, now U.S. Pat. No. 5,841,074.

FIELD OF THE INVENTION

The present invention relates generally to computer system backplanes and, more particularly, to powerplanes for distributing power in backplanes.

BACKGROUND OF THE INVENTION

A computer system backplane typically is a multi-layer substrate comprising a plurality of conductive layers interweaved with a plurality of dielectric layers. The backplane carries a plurality of parallel multiterminal sockets that receive in an edgewise manner circuit boards on which computer system components are constructed. Some of the backplane conductive layers are used for signal propagation. Other conductive layers are used to distribute the power necessary for system operation. These conductive layers are known in the art as powerplanes and are generally in the form of solid sheets of conductive material such as copper.

Each multiterminal socket typically includes a plurality of pins which pass through small, plated vias bored through the layers of the backplane. Each pin makes contact with a desired one of the backplane conductive layers. Where no connection to a particular conductive layer is desired, a region surrounding the via through that conductive layer is insulated to prevent the pin from making contact. The plated vias are sized relative to the connector pins for a press fit. Power supply connections are made in a generally similar manner.

In each powerplane, some of the plated vias make contact with load pins, i.e., pins coupled to the circuit boards received by the sockets. Other vias are connected to source pins coupled to a power supply.

It will be appreciated that due to design constraints the source pins are not always centered between the load pins, leading to unequal distribution of current over the powerplanes and unequal current sharing among the load pins. For example, load pins having a shorter linear distance to the source pins will have a lower resistance with respect to the source pins and thus will source more current than load pins further from the source pins. To avoid exceeding the current rating of the load pins closest to the power source, smaller power levels are required. This results in inefficient use of the current sourcing capacity of the for distant load pins.

An attempt to equally distribute current has been made using a stepped backplane configuration. See U.S. Pat. No. 4,450,029 to Holbert et al. In a stepped backplane, the conductive and dielectric layers are laminated while having the same transverse extent. An edge of the backplane is then milled to expose the conductive layers in a stepped fashion. Rectangular bus bars are then mounted to the exposed conductive layers to provide a parallel power distribution. The step backplane however fails to provide equal current over the length of the powerplanes and thus fails to provide equal current to each load pin. Moreover, stepped backplanes are costly as they require post lamination milling.

Consequently, there exists in the industry a need to provide a cost effective method for evenly distributing current to the load pins of a powerplane. The present invention addresses this need as well as other needs.

SUMMARY OF THE INVENTION

The present invention is a powerplane for use in a backplane power distribution system. The backplane includes a conductive sheet for distributing power from a power source to a load. The powerplane further includes source locations and load locations for coupling the conductive sheet to a power source and a load. The conductive sheet is provided with impedance variations for balancing the resistance of the conductive sheet between the source locations and load locations, thereby promoting even distribution of current to the load locations.

BRIEF DESCRIPTION OF THE DRAWINGS

FIG. 4 is a perspective view of a circuit board coupled to the powerplane.

DETAILED DESCRIPTION OF THE EMBODIMENTS

Figure 1:
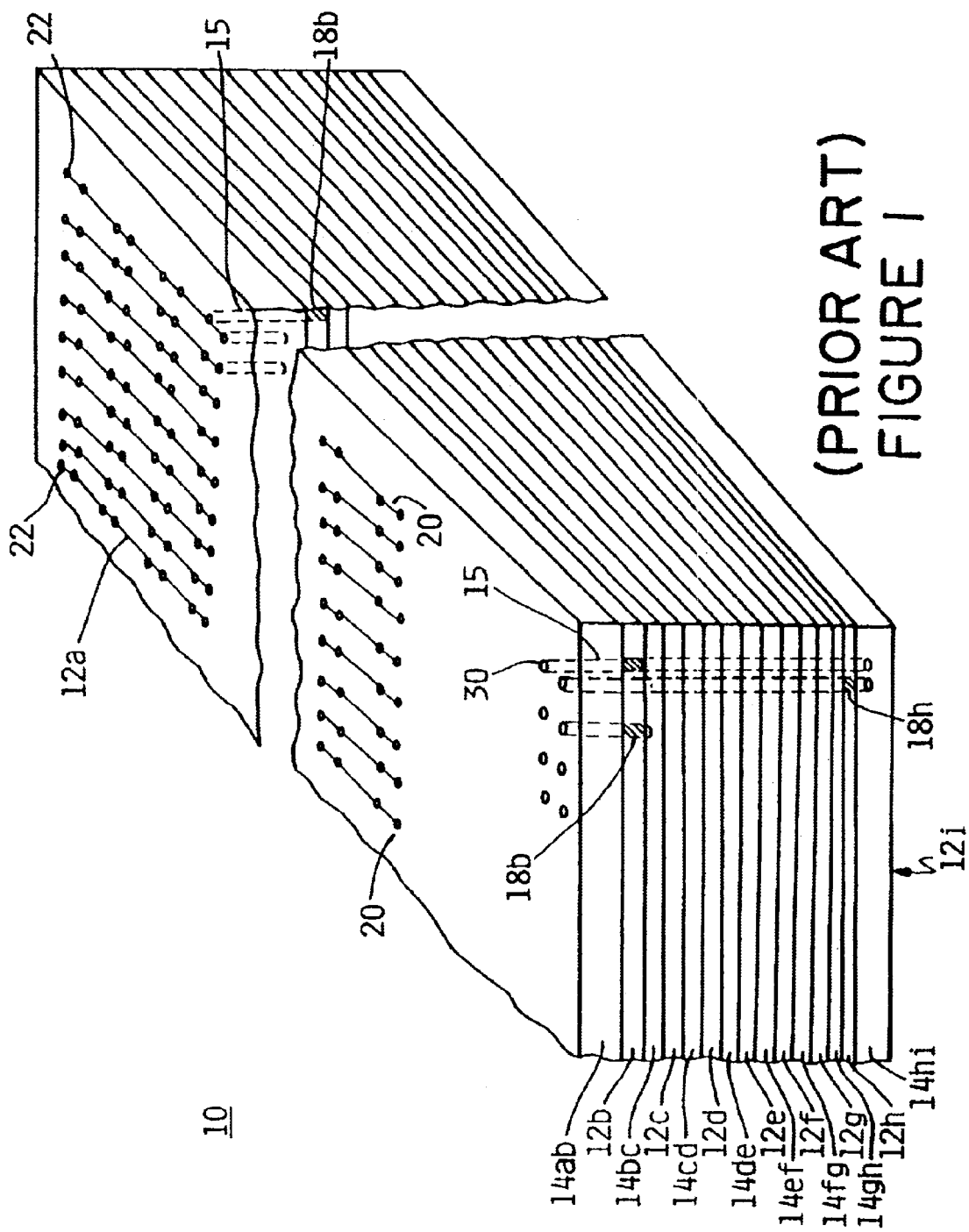
FIG. 1 is a sectioned, perspective view of a conventional backplane with a thickness greatly exaggerated relative to the transverse dimensions.

Referring now to the drawings, and more particularly to FIG. 1, there is shown a backplane 10 for use in a system requiring power distribution, e.g., a computer system. Backplane 10 is typically a laminated structure comprising a plurality of alternating conductive layers 12$a$–$i$ and interweaved dielectric layers 14$ab$, 14$bc$, . . . and 14$hi$. The conductive layers may be implemented with copper, gold, silver-palladium, alloy, tungsten, etc. The dielectric layers may be fiberglass-epoxy composites. It is noted that the conductive and dielectric layers have been numbered such that each conductive layer has a single letter associated with it and each dielectric layer has associated therewith the two letters that are associated with the immediately neighboring conductive layers. The conductive layers may be less than 50 microns thick. Thus, it is important to note that the thickness of backplane 10 has been exaggerated in order to show the conductive and dielectric layers clearly.

Backplane 10 provides electrical communication between a power source and various functional units or loads. For example, in a computer system, the functional units may be circuit boards carrying electrical components. Some of the conductive layers 12$a$–$i$ may be signal layers for signal propagation while other layers may be powerplanes for providing particular direct current (DC) voltage levels to the functional units. For example, in computer systems, the DC voltage levels are typically 5 volts, 3.3 volts, or even lower. In the exemplary embodiment, conductive layers 12$a$ and 12$i$ are signal layers and layers 12$b$–$h$ are powerplanes.

Backplane 10 is provided with an array of locations for coupling the backplane 10 to functional units. For example, the locations may be connector straps or pads, wiring networks, etc. In the exemplary embodiment, the locations are holes or vias 15 which receive load pins that will be mechanically and electrically positioned in relative near locations 20 and distant locations 22 to source locations 30. The formation of vias 15 is described more fully hereinbelow. The number of load locations 20, 22 and the number of source pins 30 vary according to the environment in which backplane 10 is used. In computer systems, the number of load locations 20, 22 depends on the number of circuit boards to be plugged in backplane 10 as well as the power requirements of the circuit boards and the current carrying capability of the pins. The number of source locations 30 depends on similar variables. Load locations 20, 22 and source locations 30 extend through the layers of backplane 10 and into sockets mounted on backplane 10. The sockets may include resilient contacts for coupling the contacts on a functional unit, e.g., a circuit board or a power supply, to load locations 20, 22 or source locations 30.

In the exemplary embodiment, pins may be press fit into load locations 20, 22 and source locations 30 of backplane 10. In the alternative embodiments, pins may be soldered or bolted down to load locations 20, 22 and source locations 30 of the backplane 10, or the functional units may contain the pins for insertion into the array of vias 15 provided by backplane 10. Vias 15 may be plated so that a corresponding pin makes contact with a desired one of the backplane conductive layers, whether a signal layer or a powerplane, as shown as 18b and 18h on FIG. 1 where plated vias contact conductive layer 12b and 12h, respectively. Where connection to a given layer is not desired, a region may be provided surrounding the hole through that particular conductive layer to insulate the conductive layer from the pin. Thus, backplane 10 has an array of vias passing through the powerplanes but making electrical contact with only certain conductive layers.

Figure 2:
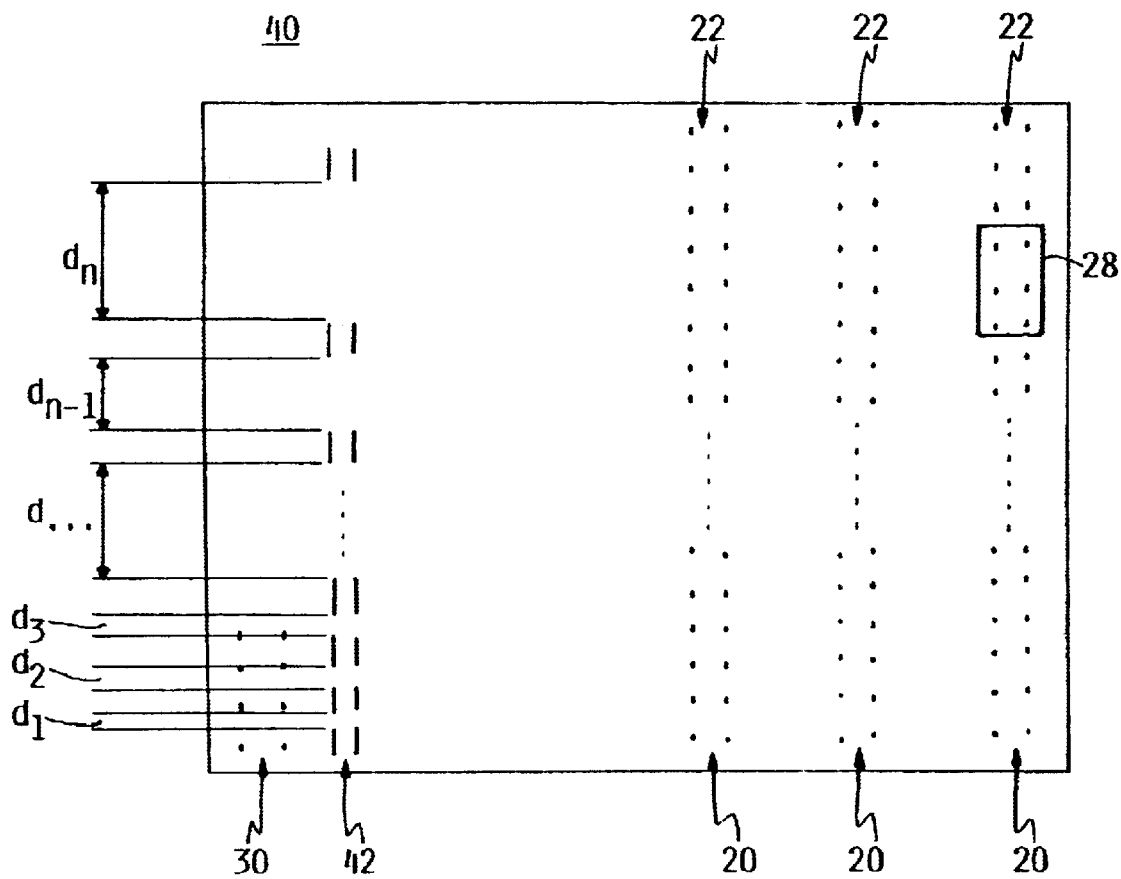
FIG. 2 is a plan view of an exemplary powerplane conductive layer of a backplane showing the structural features of an embodiment of the invention to vary the resistance along the dimensions of the backplane.

FIG. 2 illustrates an exemplary powerplane 40 receiving connection pins at load locations 20, 22 and source locations 30 for distributing power from a power source to functional units. A functional unit may also be coupled to the powerplane 40 by means of connector straps or pads or wiring network 28. Henceforth, it should be understood that the electrical characteristics of power distribution on the powerplane 40 to the load locations 20, 22 shall also apply to any load or functional unit coupled to the powerplane 40 with connection straps, pads, or wiring networks 28. Powerplane 40 is provided with the array of vias 15 vais mentioned above and a plurality of resistances or impedance variations 42. In powerplanes, there is very little inductance, so the terms resistance and impedance are used interchangeably. Balancing the resisance is the main objective because by doing so, this will balance the current. It is also true, however, to say that the impedance is balanced because both the inductive part and the resistive part of the impedance will be balanced. Impedance variations 42 balance the resistance of powerplane 40 between source location 30 and load locations 20, 22 as described hereinbelow. As shown in the exemplary embodiment of FIG. 2, impedance variations 42 may be rectangular voids in the conductive sheet comprising powerplane 40 and may be provided in multiple rows, extending parallel to load locations 20, 22 and disposed between load locations 20 and source locations 20. Furthermore, in the exemplary embodiment, impedance variations 42 are spaced more closely near source locations 30 with the spacing gradually increasing as impedance variations 42 move further from source locations 30, i.e., $d_1$ is less than $d_{x+1}$ is less than $d_{n-1}$ is less than $d_n$, as illustrated in FIG. 2.

It should be appreciated that the resistance between a load locations 20, 22 and a source locations 30 is a function of the resistivity and dimensions of the conductive material between the locations. In conventional powerplanes, i.e., those without impedance variations 42, load locations further from source locations have a higher resistance than load location closer to source locations. This results from the increased length of the conductive material. By providing impedance variations 42 having an increasing spacing as described above, the resistance between source locations 30 and near load locations 20 increases relative to the resistance between source location 30 and distant load location 22. This provides a more even load location-to-source resistance for all load locations without changing the design of the locations layout. Accordingly, current is shared more evenly between load locations 20, 22 and the voltage difference between distant load locations 22 and near load locations 20 is reduced to near zero. As a result, the functional unit placed anywhere on the powerplane 40 recieves substantially the same voltage level irrespective of its position on the power plane for more reliable operation.

Figure 3:
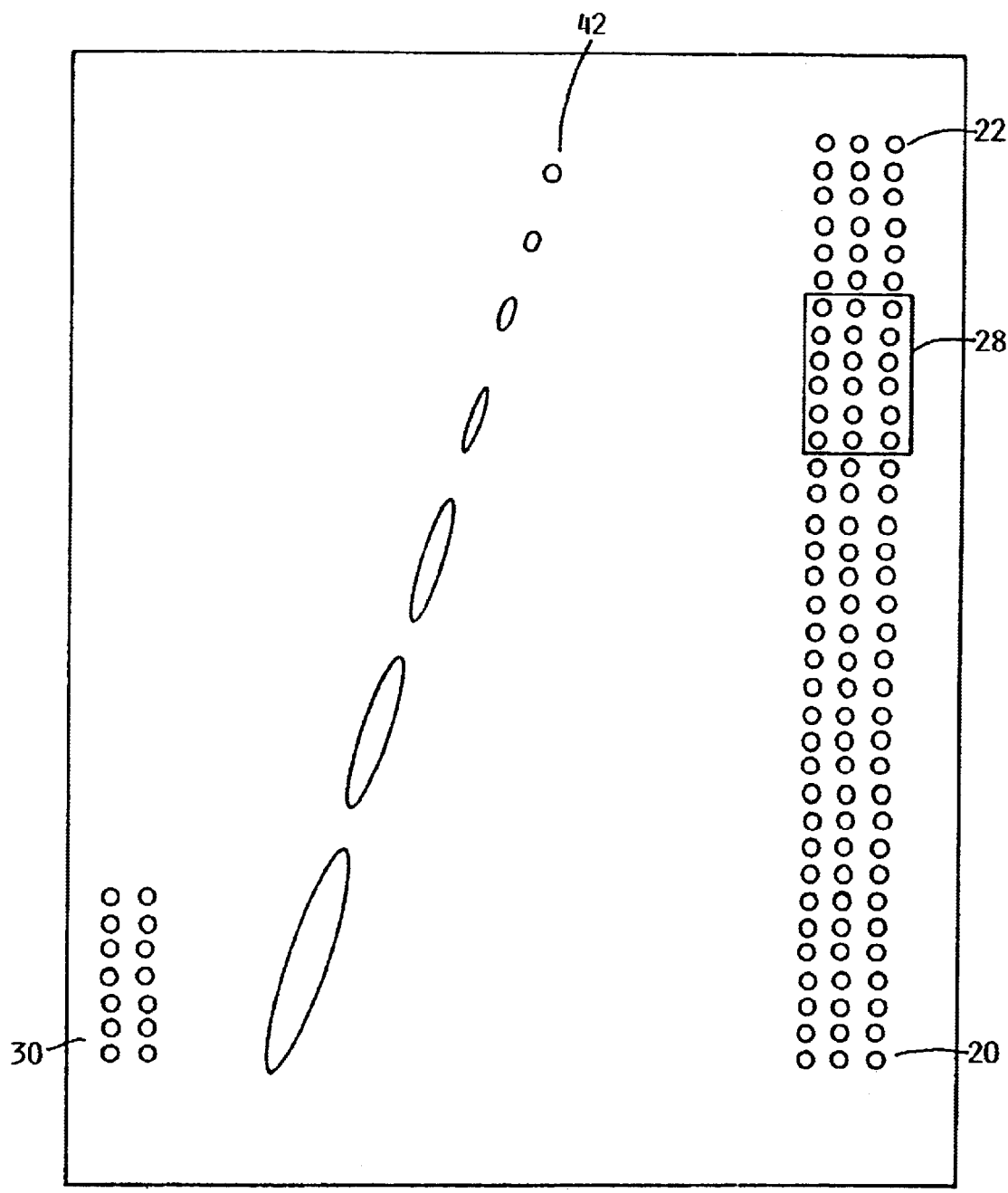
FIG. 3 is a plan view of a powerplane conductive layer of a backplane showing the structural features of an alternative embodiment of the invention to vary the resistance along the dimensions of the backplane.

It is noted that the characteristics and/or location of impedance variations 42 may vary, provided the resistance between load locations 20, 22 and source locations 30 is substantially the same for all load locations 20, 22. For example, impedance variations 42 may be circular or noncircular, and the location of impedance variations 42 need not run substantially parallel to the load locations. In addition, impedance variations 42 may be provided singly or in multiple rows. Moreover, rather than being voids in powerplane 40, impedance variations 42 may be comprised of nonconductive material, or even conductive material having a resistivity greater than the resistance of the surrounding sheet, provided that in the later instance, the spacing between impedance variations 42 decreases as impedance variations 42 move away from source locations 30. In other embodiments, impedance variations 42 may comprise variations in the thickness of powerplane 40. For example, powerplane 40 may be thinner near source locations 30 and gradually thicken as it moves further from source locations 30. FIG. 3 illustrates examples of noncircular resistances or impedance variations 42 which are not necessary parallel to load locations 30. In FIG. 3, resistances or impedance variations may represent voids or nonconductive materials or variations in the thickness of the powerplane 40 as described above.

Some of the above described structural features may be better understood with reference to an exemplary fabrication sequence. The first step involves providing the conductive and dielectric layers for lamination. These layers may be provided as separate conductive and dielectric layers, or as a number of composite or dielectric only layers. Composite, layers may include a copper-dielectric composite or a copper-dielectric-copper composite. In the latter composite, the dielectric layer is prepreg material having outer gel-cured layers and an inner completely cured layer.

Prior to lamination of all the layers to form the backplane, each conductive layer 12a–i is etched with an appropriate pattern. As noted above, load locations 20, 22 and source locations 30 typically pass through all the conductive layers 12a–i. Where a connection of a pin to a given layer is not desk the etching step may remove appropriate material in the vicinity of a via 15 for the particular pin. During the etching step, impedance variations 42 may also be etched. Advantageously, no additional expense would be incurred by providing impedance variations 42 during etching. It is noted that impedance variations 42 may alternatively be provided, for example, by using a release agent such as silicone-impregnated tape or by providing a conductive material having a different resistivity than that of surrounding powerplane 40.

After etching, the various layers are laminated under heat and pressure to form a single rigid assembly. Vias 15 for load locations 20, 22 and source locations 30 may then be drilled through the rigid laminated structure and plated to facilitate contact to a desired conductive layer. FIG. 4 illustrates a circuit board 52 coupled to a socket module 50 which is connected at load locations 20 to the powerplane 40.

It will, of course, be understood that various modifications and additions can be made to the embodiments discussed herein above without parting from the scope or spirit of the present invention. For example, the powerplane may be employed in other systems requiring power distribution, such as telecommunications systems, local area networks, programmable logic controllers, etc. Accordingly, the scope of the present invention should not be limited to the particular embodiments discussed above, but should be defined only by full and fair scope of the claim set forth below.

What is claimed is:

1. A powerplane for use in a backplane power distribution system, comprising:
   (a) a conductive sheet;
   (b) at least one source location on said conductive sheet for coupling to a power source;
   (c) a plurality of load locations on said conductive sheet for coupling to at least one load;
   (d) a plurality of resistance variations in the thickness of said conductive sheet between said at least one source location and said plurality of load locations so that substantially the same amount of current is distributed to each of said plurality of load locations from said power source coupled to at least one source location.

2. A powerplane according to claim 1, wherein said powerplane includes a plurality of load pins and at least one source pin and wherein said at least one source location and said plurality of load locations comprise vias for receiving a corresponding one of said at least one source pin and said load pins, at least a portion of said vias having plated perimeters for electrically connecting said powerplane to said load pins and source pins.

3. A powerplane according to claim 1, wherein said conductive sheet comprises copper.

4. A backplane power distribution system for distributing power from a power source, comprising:
   a laminate having
      a plurality of interleaved dielectric layers and conductive layers wherein at least one of said conductive layers is a powerplane for distributing said power; and
      a plurality of source locations and load locations, said source locations being provided to couple said powerplane to said power source and said load locations being provided to couple said powerplane to at least one load,
      a plurality of resistance variations arranged within the thickness of said powerplane to distribute current so the voltage difference between load locations is reduced to near zero.

5. A backplane power distribution system according to claim 4, wherein said source locations and said load locations define a plurality of holes passing through said laminate, said holes forming vias in each of said layers of said laminate, said vias being adapted to couple said powerplane to said loads and said power source.

6. A backplane power distribution system according to claim 5, wherein said laminate further includes source pins and load pins, and wherein a first number of said vias in at least one of said conductive layers are provided with plated perimeters for connection to said load pins and said source pins and a second number of said vias in said at least one of said conductive layer are provided with an insulated perimeter for insulating said second number of vias from said load pins and source pins.

7. A backplane power distribution system according to claim 4, wherein said conductive layers comprise copper.

8. A backplane power distribution system according to claim 4, wherein said load locations are provided to couple said powerplane to at least one circuit board.

9. A powerplane for use in a backplane power distribution system, comprising:
   (a) a conductive sheet;
   (b) means to electrically couple a power source to said conductive sheet;
   (c) means to electrically couple at least one load to said conductive sheet;
   (d) means comprising a plurality of resistance variations within the thickness of said conductive sheet to distribute substantially the same amount of current from said power source to all of said coupled at least one load.

10. The powerplane of claim 9, wherein said conductive sheet is copper.

11. The powerplane of claim 9, wherein said means to couple said power source and said means to couple said at least one load to said conductive sheet are selected from the group comprising: connector straps, pads, and vias which receive a plurality of source pins and a plurality of load pins.

12. The powerplane of claim 11, wherein
   said plurality of load locations further comprises near load locations and distant load locations with said near load locations being nearer to said plurality of source locations than said distant load locations, and
   wherein said means of a plurality of resistance variations within the thickness of the conductive sheet to distribute substantially the same amount of current further comprises:
      means within the thickness of said conductive sheet to variably increase the resistance of the conductive sheet between said plurality of source locations and said load locations, and
      means within the thickness of said conductive sheet to substantially reduce the voltage difference between said near load locations and said distant load locations.

13. A powerplane for use in a backplane power distribution system, comprising:
   (a) a conductive sheet;
   (b) at least one source location on said conductive sheet for coupling to a power source;
   (c) a plurality of load locations on said conductive sheet for coupling to at least one load;
   (d) a plurality of circular and noncircular resistance variations within the thickness of said conductive sheet so that the current from the coupled power source at said at least one source location to all of said loads coupled to said plurality of load locations is substantially equal.

14. The powerplane of claim 13, wherein said resistance variations are voids within the plane of said conductive sheet.

15. The powerplane of claim 13, wherein said resistance variations are areas of increased thickness of said conductive sheet.

16. The powerplane of claim 13, wherein said resistance variations are materials having a greater resistance than said conductive sheet situated within the thickness of said conductive sheet.

* * * * *